(12) United States Patent
Jo et al.

(10) Patent No.: US 9,406,379 B2
(45) Date of Patent: Aug. 2, 2016

(54) RESISTIVE RANDOM ACCESS MEMORY WITH NON-LINEAR CURRENT-VOLTAGE RELATIONSHIP

(71) Applicant: Crossbar, Inc., Santa Clara, CA (US)

(72) Inventors: Sung Hyun Jo, Sunnyvale, CA (US); Kuk-Hwan Kim, San Jose, CA (US)

(73) Assignee: CROSSBAR, INC., Santa Clara, CA (US)

( * ) Notice: Subject to any disclaimer, the term of this patent is extended or adjusted under 35 U.S.C. 154(b) by 354 days.

(21) Appl. No.: 13/733,843

(22) Filed: Jan. 3, 2013

(65) Prior Publication Data

US 2014/0185358 A1    Jul. 3, 2014

(51) Int. Cl.
*H01L 45/00* (2006.01)
*G11C 13/00* (2006.01)

(52) U.S. Cl.
CPC .......... *G11C 13/004* (2013.01); *G11C 13/0007* (2013.01); *H01L 45/04* (2013.01); *H01L 45/085* (2013.01); *H01L 45/1233* (2013.01); *H01L 45/1266* (2013.01); *G11C 2213/15* (2013.01); *G11C 2213/52* (2013.01); *G11C 2213/55* (2013.01); *G11C 2213/77* (2013.01)

(58) Field of Classification Search
CPC ... H01L 45/08; H01L 45/085; H01L 45/1266; G11C 13/0009; G11C 13/0011; G11C 2213/51; G11C 2213/55
See application file for complete search history.

(56) References Cited

U.S. PATENT DOCUMENTS

| 680,652 A | 8/1901 | Elden |
| 4,433,468 A | 2/1984 | Kawamata |
| 4,684,972 A | 8/1987 | Owen et al. |
| 4,741,601 A | 5/1988 | Saito |
| 5,139,911 A | 8/1992 | Yagi et al. |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,538,564 A | 7/1996 | Kaschmitter |
| 5,541,869 A | 7/1996 | Rose et al. |
| 5,594,363 A | 1/1997 | Freeman et al. |
| 5,614,756 A | 3/1997 | Forouhi et al. |
| 5,645,628 A | 7/1997 | Endo et al. |

(Continued)

FOREIGN PATENT DOCUMENTS

| EP | 2405441 A1 | 1/2012 |
| EP | 2408035 A2 | 1/2012 |

(Continued)

OTHER PUBLICATIONS

Notice of Allowance for U.S. Appl. No. 13/725,331, dated Jan. 17, 2014.

(Continued)

*Primary Examiner* — Allison P Bernstein
(74) *Attorney, Agent, or Firm* — Amin, Turocy & Watson, LLP

(57) ABSTRACT

Providing for fabrication, construction, and/or assembly of a resistive random access memory (RRAM) cell is described herein. The RRAM cell can exhibit a non-linear current-voltage relationship. When arranged in a memory array architecture, these cells can significantly mitigate sneak path issues associated with conventional RRAM arrays.

20 Claims, 10 Drawing Sheets

(56) References Cited

U.S. PATENT DOCUMENTS

| | | |
|---|---|---|
| 5,707,487 A | 1/1998 | Hori et al. |
| 5,714,416 A | 2/1998 | Eichman et al. |
| 5,751,012 A | 5/1998 | Wolstenholme et al. |
| 5,840,608 A | 11/1998 | Chang |
| 5,970,332 A | 10/1999 | Pruijmboom et al. |
| 5,998,244 A | 12/1999 | Wolstenholme et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,259,116 B1 | 7/2001 | Shannon |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,627,530 B2 | 9/2003 | Li et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,848,012 B2 | 1/2005 | LeBlanc et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,881,994 B2 | 4/2005 | Lee et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,858,468 B2 | 12/2010 | Liu et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,972,897 B2 | 7/2011 | Kumar et al. |
| 7,984,776 B2 | 7/2011 | Beyer et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Albano et al. |
| 8,233,308 B2 | 7/2012 | Schricker et al. |
| 8,237,146 B2 | 8/2012 | Kreupl et al. |
| 8,258,020 B2 | 9/2012 | Herner |
| 8,265,136 B2 | 9/2012 | Hong et al. |
| 8,274,812 B2 | 9/2012 | Jo et al. |
| 8,315,079 B2 | 11/2012 | Kuo et al. |
| 8,320,160 B2 | 11/2012 | Nazarian |
| 8,374,018 B2 | 2/2013 | Lu |
| 8,385,100 B2 | 2/2013 | Kau et al. |
| 8,389,971 B2 | 3/2013 | Chen et al. |
| 8,394,670 B2 | 3/2013 | Herner |
| 8,399,307 B2 | 3/2013 | Herner |
| 8,441,835 B2 | 5/2013 | Jo et al. |
| 8,467,227 B1 | 6/2013 | Jo |
| 8,587,989 B2 | 11/2013 | Manning et al. |
| 8,658,476 B1 | 2/2014 | Sun et al. |
| 8,659,003 B2 | 2/2014 | Herner et al. |
| 2003/0052330 A1 | 3/2003 | Klein |
| 2003/0141565 A1 | 7/2003 | Hirose et al. |
| 2003/0174574 A1 | 9/2003 | Perner et al. |
| 2003/0206659 A1 | 11/2003 | Hamanaka |
| 2004/0026682 A1 | 2/2004 | Jiang |
| 2004/0170040 A1 | 9/2004 | Rinerson et al. |
| 2004/0192006 A1 | 9/2004 | Campbell et al. |
| 2004/0194340 A1 | 10/2004 | Kobayashi |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0175099 A1 | 8/2005 | Sarkijarvi et al. |
| 2006/0017488 A1 | 1/2006 | Hsu |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 | 4/2007 | Kumar et al. |
| 2007/0091685 A1 | 4/2007 | Guterman et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |

(56) References Cited

U.S. PATENT DOCUMENTS

| | | |
|---|---|---|
| 2008/0185567 A1 | 8/2008 | Kumar et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0003717 A1 | 1/2009 | Sekiguchi et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006346 A1 | 1/2011 | Roelofs et al. |
| 2011/0089391 A1 | 4/2011 | Mihnea et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0312151 A1 | 12/2011 | Herner |
| 2011/0317470 A1 | 12/2011 | Lu et al. |
| 2012/0001145 A1 | 1/2012 | Magistretti et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043518 A1* | 2/2012 | Cheng et al. ............ 257/4 |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0074374 A1 | 3/2012 | Jo |
| 2012/0076203 A1 | 3/2012 | Sugimoto et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0236625 A1 | 9/2012 | Ohba et al. |
| 2012/0250183 A1 | 10/2012 | Tamaoka et al. |
| 2012/0269275 A1 | 10/2012 | Hannuksela |
| 2012/0305874 A1 | 12/2012 | Herner |
| 2012/0326265 A1 | 12/2012 | Lai et al. |
| 2013/0020548 A1 | 1/2013 | Clark et al. |

FOREIGN PATENT DOCUMENTS

| | | |
|---|---|---|
| JP | 2005-506703 A | 3/2005 |
| JP | 2006-032951 A | 2/2006 |
| JP | 2007-067408 A | 3/2007 |
| JP | 2007-281208 A | 10/2007 |
| JP | 2007-328857 A | 12/2007 |
| KR | 1020110014248 A | 2/2011 |
| WO | WO 03/034498 A1 | 4/2003 |
| WO | WO 2009/005699 A1 | 1/2009 |

OTHER PUBLICATIONS

Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 13/434,567, dated Feb. 6, 2014.
Office Action for U.S. Appl. No. 13/620,012, dated Feb. 11, 2014.
Notice of Allowance for U.S. Appl. No. 13/468,201, dated Feb. 20, 2014.
Office Action for U.S. Appl. No. 12/625,817, dated Feb. 28, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
International Search Report and Written Opinion for PCT/US2013/077628, filed on Dec. 23, 2013.
Jian Hu et al., "Area-Dependent Switching in Thin Film-Silicon Devices", Materials Research Society, Mal. Res. Soc. Symp Proc., 2003, pp. A18.3.1-A18.3.6, vol. 762.
André Dehon, "Array-Based Architecture for FET-Based, Nanoscale Electronics", IEEE Transactions on Nanotechnology, Mar. 2003, pp. 23-32, vol. 2, No. 1, IEEE.
Herb Goronkin et al., "High-Performance Emerging Solid-State Memory Technologies", MRS Bulletin, www.mrs.org/publications/bulletin, Nov. 2004, pp. 805-813.
Gerhard Müller et al., "Status and Outlook of Emerging Nonvolatile Memory Technologies", IEEE, 2004, pp. 567-570.
A.E. Owen et al., "Memory Switching in Amorphous Silicon Devices", Journal of Non-Crystalline Solids 59 & 60, 1983, pp. 1273-1280, North Holland Publishing Company/Physical Society of Japan.
J. Campbell Scott, "Is There an Immortal Memory?", www.sciencemag.org, Apr. 2, 2004, pp. 62-63, vol. 304 No. 5667, American Association for the Advancement of Science.
S.H. Lee et al., "Full Integration and Cell Characteristics for 64Mb Nonvolatile PRAM", 2004 Symposium on VLSI Technology Digest of Technical Papers, IEEE, 2004, pp. 20-21.
Stephen Y. Chou et al., "Imprint Lithography With 25-Nanometer Resolution", Science, Apr. 5, 1996, pp. 85-87, vol. 272, American Association for the Advancement of Science.
S. Zankovych et al., "Nanoimprint Lithography: challenges and prospects", Nanotechnology, 2001, pp. 91-95, vol. 12, Institute of Physics Publishing.

(56) References Cited

OTHER PUBLICATIONS

A. Avila et al., "Switching in coplanar amorphous hydrogenated silicon devices", Solid-State Electronics, 2000, pp. 17-27, vol. 44, Elsevier Science Ltd.
Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.
S. Hudgens et al., "Overview of Phase-Change Chalcogenide Nonvolatile Memory Technology", MRS Bulletin, www.mrs.org/publications/bulletin, Nov. 2004, pp. 829-832.
K. Terabe et al., "Quantized conductance atomic switch", Nature, www.nature.com/nature, Jan. 6, 2005, pp. 47-50, vol. 433, Nature Publishing Group.
Michael Kund et al., "Conductive bridging RAM (CBRAM): An emerging non-volatile memory technology scalable to sub 20nm", IEEE, 2005.
W. Den Boer, "Threshold switching in hydrogenated amorphous silicon", Appl. Phys. Letter, 1982, pp. 812-813, vol. 40, American Institute of Physics.
P.G. Lecomber et al., "The Switching Mechanism in Amorphous Silicon Junctions", Journal of Non-Crystalline Solids,1985, pp. 1373-1382, vol. 77 & 78, Elsevier Science Publishers B.V., North Holland Physics Publishing Division, North-Holland, Amsterdam.
A. E. Owen et al., "Switching in amorphous devices", Int. J. Electronics, 1992, pp. 897-906, vol. 73, No. 5, Taylor and Francis Ltd.
M. Jafar et al., "Switching in amorphous-silicon devices", Physical Review B, May 15, 1994, pp. 611-615, vol. 49, No. 19, The American Physical Society.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16,1999, pp. 391-395, vol. 285, No. 5426, American Association for the Advancement of Science.
Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
Ex parte Quayle Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, 10, 1297-1301, 2010, pubs.acs.org/NanoLett, A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", $9^{th}$ Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of $Cr/p^+a$-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.

(56) References Cited

OTHER PUBLICATIONS

A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/861,650 dated Oct. 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Notice of Allowance for U.S. Appl. No. 12/814,410 dated Jan. 8, 2013.
Corrected Notice of Allowance for U.S. Appl. No. 12/861,666 dated Jan. 11, 2013.
Supplemental Notice of Allowance for U.S. Appl. No. 12/894,087 dated Jan. 11, 2013.
Notice of Allowance for U.S. Appl. No. 13/314,513 dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264 dated Mar. 6, 2013.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti-W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
Office Action of U.S. Appl. No. 13/436,714 dated Dec. 7, 2012.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432, dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312, filed on Jul. 2, 2012.
Office Action for U.S. Appl. No. 13/466,008, dated Jul. 29, 2013.
Russo, Ugo et al., "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, No. 2.
Cagli, C. et al., "Evidence for threshold switching in the set process of NiO-based RRAM and physical modeling for set, reset, retention and disturb prediction", IEEE International Electron Devices Meeting, Dec. 15-17, 2008, pp. 1-4, San Francisco, CA.
Office Action for U.S. Appl. No. 13/077,941, dated Aug. 12, 2013.
Office Action for U.S. Appl. No. 13/436,714, dated Aug. 27, 2013.
Notice of Allowance for U.S. Appl. No. 13/679,976, dated Sep. 17, 2013.
Office Action for U.S. Appl. No. 13/189,401, dated Sep. 30, 2013.
Office Action for U.S. Appl. No. 13/462,653, dated Sep. 30, 2013.
Corrected Notice of Allowance for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665, dated Aug. 2, 2013.
Notice of Allowance for U.S. Appl. No. 13/769,152, dated Oct. 8, 2013.
Notice of Allowance for U.S. Appl. No. 13/905,074, dated Oct. 8, 2013.
Notice of Allowance for U.S. Appl. No. 13/452,657, dated Oct. 10, 2013.
Notice of Allowance for U.S. Appl. No. 13/174,264, dated Oct. 16, 2013.
Notice of Allowance for U.S. Appl. No. 13/417,135, dated Oct. 23, 2013.

(56) References Cited

OTHER PUBLICATIONS

Office Action for U.S. Appl. No. 13/761,132 dated Apr. 25, 2014, 28 pages.
Office Action for U.S. Appl. No. 14/072,657 dated Jun. 17, 2014, 36 pages.
Office Action for U.S. Appl. No. 12/913,719 dated Feb. 17, 2011, 17 pages.
Office Action for U.S. Appl. No. 12/913,719 dated Jul. 22, 2011, 13 pages.
Notice of Allowance for U.S. Appl. No. 12/913,719 dated Mar. 12, 2012, 10 pages.
Office Action for U.S. Appl. No. 13/564,639 dated Mar. 19, 2013, 25 pages.
Suehle et al., "Temperature Dependence of Soft Breakdown and Wear-Out in Sub-3 nm SiO2 Films", 2000, 38th Annual International Reliability Physics Symposium, pp. 33-34, IEEE, San Jose, California, 7 pages.
Shin et al., "Effect of Native Oxide on Polycrystalline Silicon CMP", Journal of the Korean Physical Society, Mar. 2009, pp. 1077-1081, vol. 54, No. 3, 5 pages.
Office Action for U.S. Appl. No. 13/447,036 dated Jul. 9, 2013, 38 pages.
Office Action for U.S. Appl. No. 13/764,698 dated Jul. 11, 2013, 14 pages.
Office Action for U.S. Appl. No. 13/481,600 dated Sep. 20, 2013, 25 pages.
Office Action for U.S. Appl. No. 14/306,093 dated Jan. 5, 2015, 41 pages.
Office Action for U.S. Appl. No. 14/306,093 dated Aug. 24, 2015, 21 pages.

\* cited by examiner

RESISTIVE RANDOM ACCESS MEMORY WITH NON-LINEAR CURRENT-VOLTAGE RELATIONSHIP

TECHNICAL FIELD

This disclosure generally relates to semiconductor electronics and materials, and more particularly to resistive random access memory that exhibits non-linear current-voltage characteristics.

BACKGROUND

A recent innovation within the field of integrated circuit technology is resistive random access memory (RRAM). While much of RRAM technology is in the development stage, various technological concepts for RRAM have been demonstrated and are in one or more stages of verification to prove or disprove associated theory(ies). Even so, RRAM technology promises to hold substantial advantages over competing technologies in the semiconductor electronics industry.

According to various theoretical models, RRAM can be configured to have multiple resistive states; for instance, RRAM can be configured to have a relatively low resistance or a relatively high resistance. Moreover, RRAM can generally be configured to enter one or another resistive state in response to an external condition imposed upon the RRAM. Thus, in transistor parlance, applying or removing the external condition can serve to program or de-program (e.g., erase) the RRAM. Moreover, depending on physical makeup and electrical arrangement, an RRAM cell can generally maintain a programmed or de-programmed state. Maintaining a state might require other conditions be met (e.g., existence of a minimum operating voltage, existence of a minimum operating temperature, . . . ), or no conditions be met, depending on the characteristics of the RRAM. Generally speaking, the capacity to be in one of two states and maintain one or another of the states can serve to represent a logical bit of information. Thus, RRAM is theoretically usable as electronic memory in suitably arranged electronic circuits.

Several proposals for practical utilization of RRAM technology include various transistor-based memory applications. For instance, RRAM elements are often theorized as viable alternatives, at least in part, to metal-oxide semiconductor (MOS) type memory transistors commonly employed for electronic storage of digital information. Models of RRAM-based memory devices provide some potential advantages over non-volatile FLASH MOS type transistors, including smaller die size, higher memory density, faster switching (e.g., from a relatively conductive state to a relatively non-conductive state, or vice versa), good data reliability, low manufacturing cost, and others. Because of these potential benefits, and because demand for faster and smaller electronic devices appears to continue unabated, much interest in RRAM technology and RRAM development exists

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Apparatuses disclosed herein relate to a resistive random access memory cell. The cell can include a first metal layer comprising a first electrical conductive metal and a second metal layer comprising a second electrical conductive metal. The cell can include a resistive switching material layer situated between the first metal layer and the second metal layer comprising a switching material that is an electrical insulator. The cell can include a first semiconductor layer situated between the resistive switching material layer and the first metal layer comprising a lightly doped semiconductor material.

Methods disclosed herein relate to fabricating a resistive random access memory cell, e.g., by a system including a processor. A heavily doped semiconductor stratum can be included adjacent to a first electrode comprising a first electrical conductive metal stratum. A lightly doped semiconductor stratum can be included adjacent to the heavily doped semiconductor stratum. A resistive switching material stratum comprising an electrical insulator material can be included adjacent to the lightly doped semiconductor stratum. A second electrode comprising a second electrical conductive metal stratum can be included adjacent to the resistive switching material stratum.

Systems disclosed herein relate to a computer readable storage medium storing computer-executable instructions that, in response to execution, cause a device including a processor to perform operations. Such operations can include forming a first electrical conductive metal layer. The operations can further include forming a heavily doped semiconductor layer that provides ohmic contact with the first electrical conductive metal layer. The operations can further include forming a lightly doped semiconductor layer adjacent to the heavily doped semiconductor layer. The operations can further include forming a resistive switching material layer comprising an electrical insulator material adjacent to the lightly doped semiconductor layer and forming a second electrical conductive metal layer adjacent to the resistive switching material layer.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout, and in which.

DETAILED DESCRIPTION

Introduction

Figure 1A:
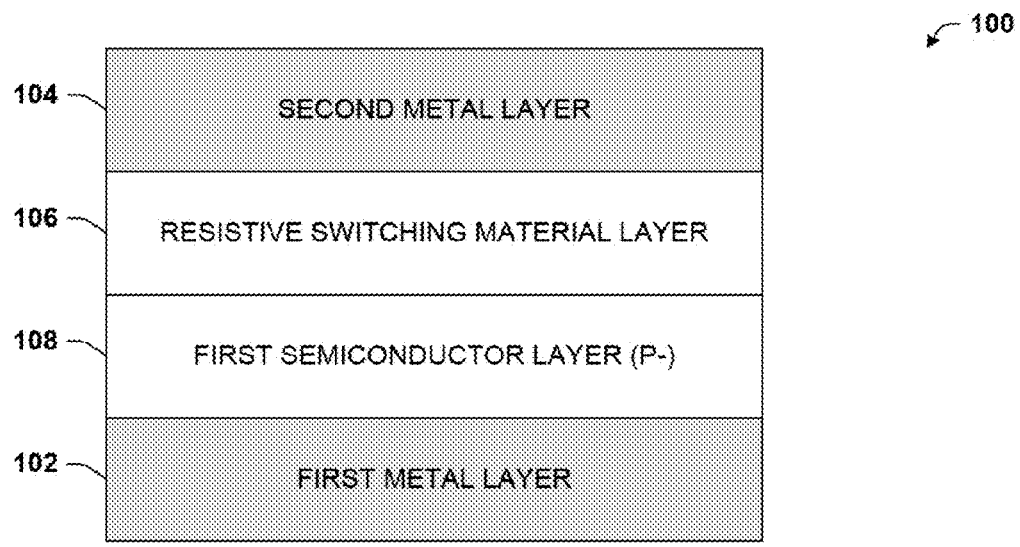
FIG. 1A illustrates a block diagram of a first example of p-type resistive random access memory (RRAM) cell that exhibits a non-linear relationship between current and voltage in accordance with certain embodiments of this disclosure.

This disclosure relates to two-terminal memory cells, in various embodiments. Two-terminal memory devices, as utilized herein, comprise circuit components having two electrical contacts (also referred to herein as electrodes or terminals) with an active region between the two conductive contacts. The active region of the two-terminal memory device exhibits non-linear non-volatile resistive characteristics in response to a voltage difference applied at the two conductive contacts. Examples of two-terminal memory devices, though not exhaustive, can include resistive random access memory (RRAM), phase-change memory (PCM), a phase-change random access memory (PCRM), a magneto-resistive access memory (MRAM) or a ferroelectric random access memory (FeRAM), or the like, or a suitable combination thereof.

With respect to RRAM, an example of RRAM can include a filamentary-based RRAM, which in turn can include: a p-type or n-type silicon bearing layer (e.g., p-type or n-type polysilicon, p-type or n-type SiGe), an undoped amorphous silicon layer, which can also be referred to as a resistive switching material (RSML) layer (e.g., having intrinsic characteristics), and an active metal layer for providing filament forming ions to the amorphous silicon/RSML layer (e.g., silver (Ag), gold (Au), titanium (Ti), nickel (Ni), aluminum (Al), chromium (Cr), iron (Fe), manganese (Mn), tungsten (W), vanadium (V), cobalt (Co), platinum (Pt), and palladium (Pd)) as well as other layers detailed herein. Some details pertaining to RRAM similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties.

It should be appreciated that a variety of RRAM technologies exist, having different physical properties. For instance, different RRAM technologies can have different discrete programmable resistances, different associated program/erase voltages, as well as other differentiating characteristics. For instance, a unipolar RRAM, once initially programmed, can be later programmed in response to a first positive voltage (e.g., three volts) and erased in response to a second positive voltage (e.g., between four and five volts). Bipolar RRAM, on the other hand, becomes programmed in response to a positive voltage and erased in response to a negative voltage. Where no specific RRAM technology or program/erase voltage is specified for the various aspects and embodiments herein, it is intended that such aspects and embodiments incorporate any suitable RRAM technology and be operated by program/erase voltages appropriate to that RRAM technology, as would be known by one of ordinary skill in the art or made known by way of the context provided herein. It should be appreciated further that where substituting a different RRAM technology would require circuit modifications that would be known to one of ordinary skill in the art, or changes to operating signal levels that would be known to one of such skill, embodiments comprising the substituted RRAM technology(ies) or signal level changes are considered within the scope of the subject disclosure.

RRAM memory cells have several advantages over conventional FLASH or metal oxide semiconductor (MOS) memory devices. For instance, RRAM technology can generally be smaller, typically consuming silicon area on the order of 4 $F^2$ per adjacent RRAM device (e.g., a memory cell comprising two RRAM devices would therefore be approximately 8 $F^2$ if constructed in adjacent silicon space). Non-adjacent RRAM devices, e.g., stacked above or below each other, can consume as little as 4 $F^2$ for a set of multiple non-adjacent devices. Such can lead to greater semiconductor component density and memory density, and low manufacturing costs for a given number of transistors relative to competing technologies. RRAM also has very fast programming and/or switching speed along with a relatively low programming current. Additionally, RRAM is non-volatile memory, having the capacity to store data without continuous application of power. In addition to the foregoing, RRAM cells can generally be built between metal interconnect layers, enabling RRAM-based devices to be usable for two-dimensional as well as three-dimensional semiconductor architectures.

To program an RRAM memory cell, a suitable program voltage can be applied across the memory cell causing a conductive filament to form through a resistive portion of the memory cell. This causes the memory cell to switch from a relatively high resistive state, to a relatively low resistive state. An erase process can be implemented to reverse the process, at least in part, causing the memory cell to return to the high resistive state from the low resistive state. This change of state, in the context of memory, can be associated with respective states of a binary bit. Accordingly, multiple such memory cells can be programmed or erased to represent respective zeroes or ones of binary information, and by retaining those states over time in effect storing binary information.

RRAM memory cells are generally quick to program and responsive, changing state readily in response to a program voltage. However, conventional mechanisms for programming an RRAM memory cell are not always efficient. For instance, applying a program voltage for a program clock cycle of a predetermined duration is one typical way of programming an RRAM memory cell. Though this is a common program technique, it has several drawbacks. First, the program voltage is actively driven, and thus an amount of charge consumed in implementing the program is limited only by the duration of the program clock cycle. Thus, where the RRAM memory cell changes state in response to the program voltage in only a fraction of the program clock cycle, a current caused by the program voltage for a remaining fraction of the program clock cycle is wasted power. Moreover, this wasted power tends to cause joule heating in the RRAM memory cell and in some cases in related circuit components. Joule heating is a well known cause of circuit degradation, and its minimization is generally desired.

In summary, RRAM has the potential to replace other types of memory existing in the marketplace due to the numerous advantages of RRAM over competing technologies. However, a significant difficulty that exists in conventional RRAM products as well as associated research and development is the so-called "sneak path problem." A sneak path (also referred to as "leak path") can be characterized by undesired current flowing through neighboring memory cells, which can be particularly evident in large passive memory crossbar arrays, particularly in connection with cells in the "on" state.

In more detail, sneak path current can result from a voltage difference across adjacent or nearby bitlines of a memory array. For instance, in conventional architectures, an RRAM memory cell positioned between metal inter-connects (e.g., bitlines and wordlines) of a crossbar array is not a true electrical insulator, and thus a small amount of current can flow in response to the aforementioned voltage differences. Further, these small amounts of current can add together, particularly when caused by multiple voltage differences observed across multiple metal inter-connects. During a memory operation, sneak path current(s) can co-exist with an operating signal (e.g., program signal, erase signal, read signal, etc.) and reduce operational margin, for example, the current and/or voltage margin between reading a programmed cell (associated with a first physical state) and an erased cell (associated with a second physical state). For instance, in conjunction with a read operation on a selected memory cell, sneak path current sharing a read path with the selected memory cell can add to a sensing current, reducing sensing margin of read circuitry.

One potential way to mitigate the sneak path problem is to employ RRAM cells that exhibit a non-linear current-voltage relationship. Accordingly, this disclosure relates to RRAM cell(s) that exhibit a non-linear current-voltage relationship.
Example RRAM Cell with Non-Linear Current-Voltage Relationship Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring initially to FIG. 1A, apparatus 100 is depicted. Apparatus 100 can be a p-type resistive random access memory (RRAM) cell that exhibits a non-linear relationship between current and voltage. For example, when a voltage differential between electrodes of the cell is changed linearly, an associated current passing through the cell does not change linearly. Because the cell (e.g., apparatus 100) exhibits a non-linear current-voltage relationship, such cells can reduce or mitigate sneak path current that might otherwise exist, particularly in large memory cell arrays.

Apparatus 100 can include first metal layer 102 and second metal layer 104 that can represent bottom and top electrodes, respectively. Between these two electrodes, resistive switching material layer 106 can reside adjacent to second metal layer 104 and first semiconductor layer 108 can be situated adjacent to first metal layer 102.

Figure 1B:
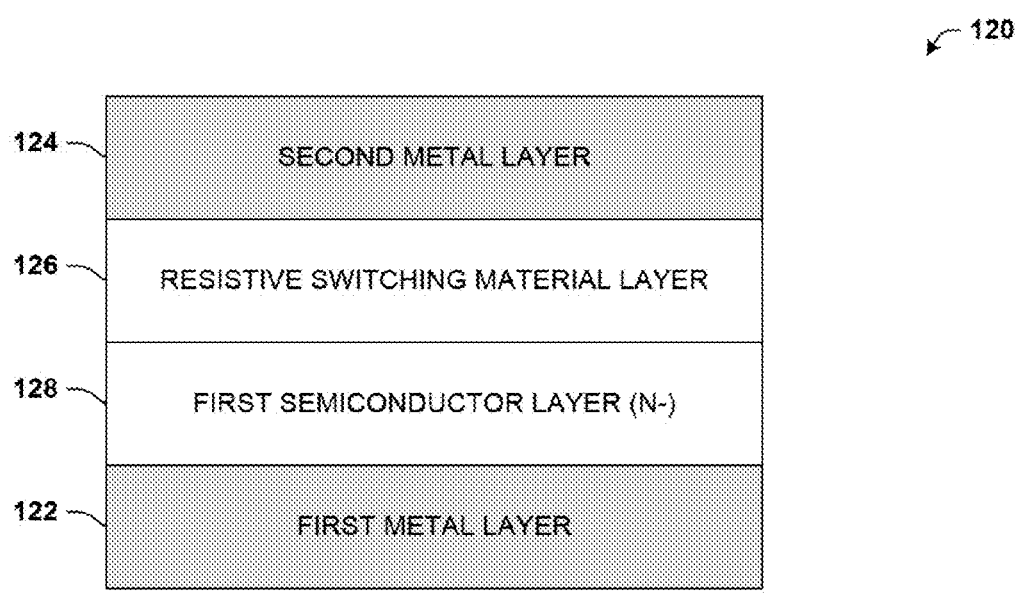
FIG. 1B illustrates a block diagram of a first example of an n-type resistive random access memory (RRAM) cell that exhibits a non-linear relationship between current and voltage in accordance with certain embodiments of this disclosure.

Referring to FIG. 1B, apparatus 120 represents a different, though similar, embodiment. In particular, apparatus 120 can include first metal layer 122, second metal layer 124, resistive switching material layer 126, and first semiconductor layer 128, all similarly situated as like elements associated with apparatus 100. Additional details, characteristics, and/or aspects associated with the layers 102-108 and similar layers 122-128 are detailed in connection with like elements of FIGS. 2A-2B. However, it is noted that one distinction between apparatus 100 and apparatus 120 (as well as apparatuses 200 and 220 of FIGS. 2A-2B) is that first semiconductor layer 108 is a positive- or p-type semiconductor material (labeled herein as "P-"), whereas first semiconductor layer 128 is a negative- or n-type semiconductor material. Thus, it is understood that the disclosed subject matter can be applicable to both p-type and n-type semiconductors. Hence, although most of the examples included herein relate to a p-type embodiment, it is understood that other embodiments can exist that are fashioned with n-type semiconductor material.

Figure 2A:
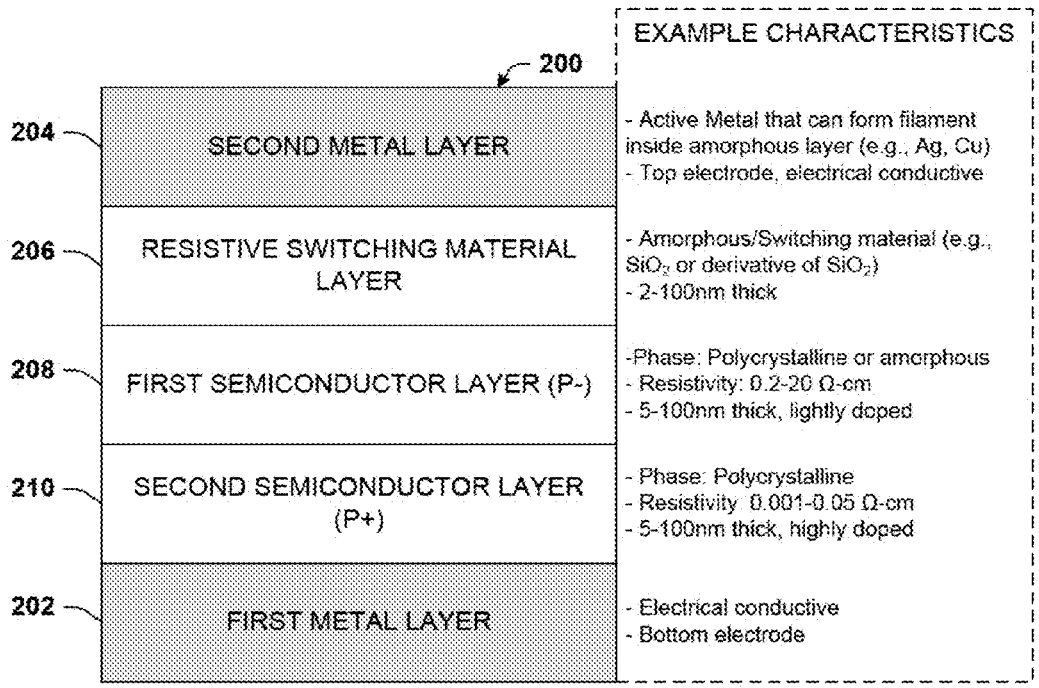
FIG. 2A illustrates a block diagram of a second example of p-type RRAM cell that exhibits a non-linear relationship between current and voltage in accordance with certain embodiments of this disclosure.

Turning now to FIG. 2A, apparatus 200 is provided, which can be substantially similar to apparatus 100 of FIG. 1. Apparatus 200 can include first metal layer 202 that can comprise a first electrical conductive metal and can operate as a bottom electrode, as noted in the callout of example characteristics. All such callout example characteristics as well as other detail included herein can relate to one or more embodiments of the disclosed subject matter and can exist for analogous layers associated with FIGS. 1A-1B.

Apparatus 200 can include second metal layer 204 that can operate as a top electrode and can be comprised of a second electrical conductive metal, which can be the same or different from the first electrical conductive metal. Apparatus 200 can also include resistive switching material layer 206 that can be situated between first metal layer 202 and second metal layer 204 and in some embodiments is adjacent to second metal layer 204. In various embodiments, resistive switching material layer 206 can be between 2 nanometers (nm) and 100 nm in thickness and can include a switching material that is an electrical insulator. For example, the switching material can include amorphous silicon, amorphous silicon germanium, silicon dioxide ($SiO_2$) or a suitable derivative of silicon dioxide, silicon-on-glass (SOG), a solid electrolyte, or another suitable chalcogenide or oxide, including silicon sub-oxide, $SiO_x$, where x<2. In some embodiments, the switching material can be formed from an upper region of a p+ polycrystalline silicon or p+ silicon germanium bearing layer using an Argon, Silicon, Oxygen plasma etch, or the like. For instance, a plasma etch may use a bias power within a range of approximately 30 watts to approximately 120 watts to convert an upper region of the polysilicon or silicon germanium material into a non-conductive amorphous silicon having p-type impurities and/or a native silicon oxide (from a polycrystalline silicon or a silicon germanium bearing layer).

Likewise, in some embodiments, second metal layer 204 can be an active metal such as, e.g., silver, copper, titanium or some other active metal. An active metal can be characterized as a metal that diffuses into the switching material in response to an electric field. For instance, when a voltage differential exists between the two electrodes (e.g., an applied bias) of cell 200, then a current can flow between the two electrodes and an electric field can be created. In response to the electric field, the active metal of second metal layer 204 can diffuse into resistive switching material layer 206, in some cases creating a conductive filament, which is further detailed with reference to FIG. 3.

Apparatus 200 can include first semiconductor layer 208 that can be situated between first metal layer 202 and second metal layer 204 and adjacent to resistive switching material layer 206 and can be comprised of a lightly doped semiconductor material. In the semiconductor domain, the process of doping is well-known and relates to the intentional addition of impurities into an otherwise extremely pure silicon semiconductor material. Such impurities are added in order to modify or modulate the electrical properties of the semiconductor according to a desired behavior. Semiconductor material that is lightly doped is generally referred to as an extrinsic semiconductor, whereas semiconductor material that is highly or heavily doped (e.g., to levels at which the semiconductor acts more like a conductor) is referred to as a degenerate semiconductor. Thus, the lightly doped semiconductor material included in first semiconductor layer 208 can be an extrinsic semiconductor material.

For example, in some embodiments, the lightly doped semiconductor material can be composed of silicon or a derivative of silicon and the outcome of the light or extrinsic doping can result in a resistivity of between 0.2 ohm-centimeter (ohm-cm) to 20 ohm-cm. It is understood that the resistivity of the lightly doped semiconductor material can be selected to meet a desired resistance of the device at the conductive state. The phase can be either polycrystalline or amorphous. In some embodiments, first semiconductor layer 208 is between 5 nm and 100 nm in thickness.

Apparatus 200 can also include second semiconductor layer 210 that can be situated between, as well as adjacent to, first semiconductor layer 208 and first metal layer 202. Second semiconductor layer 210 can be composed of a highly doped semiconductor material (e.g., a degenerate semiconductor). For example, in some embodiments, the highly doped semiconductor material can be composed of silicon or a derivative of silicon and the outcome of the high or degenerate doping can result in a resistivity of between 0.001 ohm-cm to 0.05 ohm-cm. In some embodiments, the phase is polycrystalline, and second semiconductor layer 210 can also be between 5 nm and 100 nm in thickness. It is understood that thicknesses provided herein are intended to be examples and not limiting. Other thicknesses for any of the various layers, should they be suitable, are also contemplated.

Figure 2B:
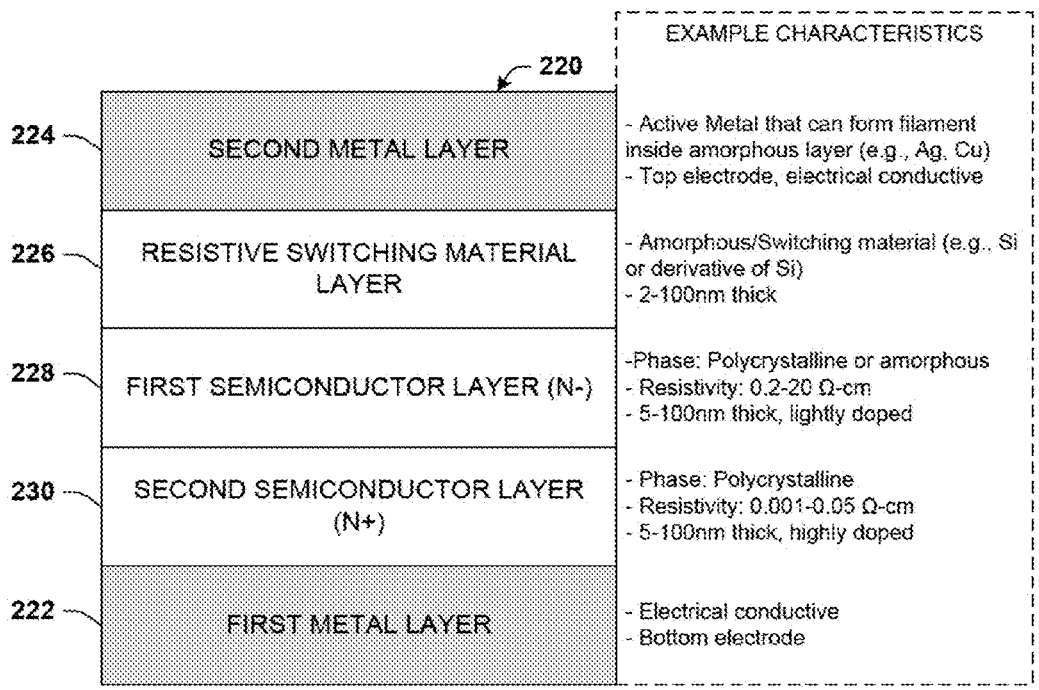
FIG. 2B illustrates a block diagram of a second example of n-type RRAM cell that exhibits a non-linear relationship between current and voltage in accordance with certain embodiments of this disclosure.

FIG. 2B depicts apparatus 220 that can be substantially similar to apparatus 200. However, once again, one distinction between the two is that apparatus 200 relates to p-type semiconductor material, while apparatus 220 relates to n-type material. Hence, first semiconductor layer 208 is denoted with "P−" and can be referred to herein as the "P− layer," while first semiconductor layer 228 is labeled with "N−" and can be referred to herein as the "N− layer." Similarly, second semiconductor layer 210 and second semiconductor layer 230 are labeled with "P+" and "N+," respectively, and can be referred to herein as the "P+ layer" and the "N+ layer," respectively. P−, P+, N−, or N+ are so labeled by convention and can be labeled alternatively or according to a different convention.

Figure 3:
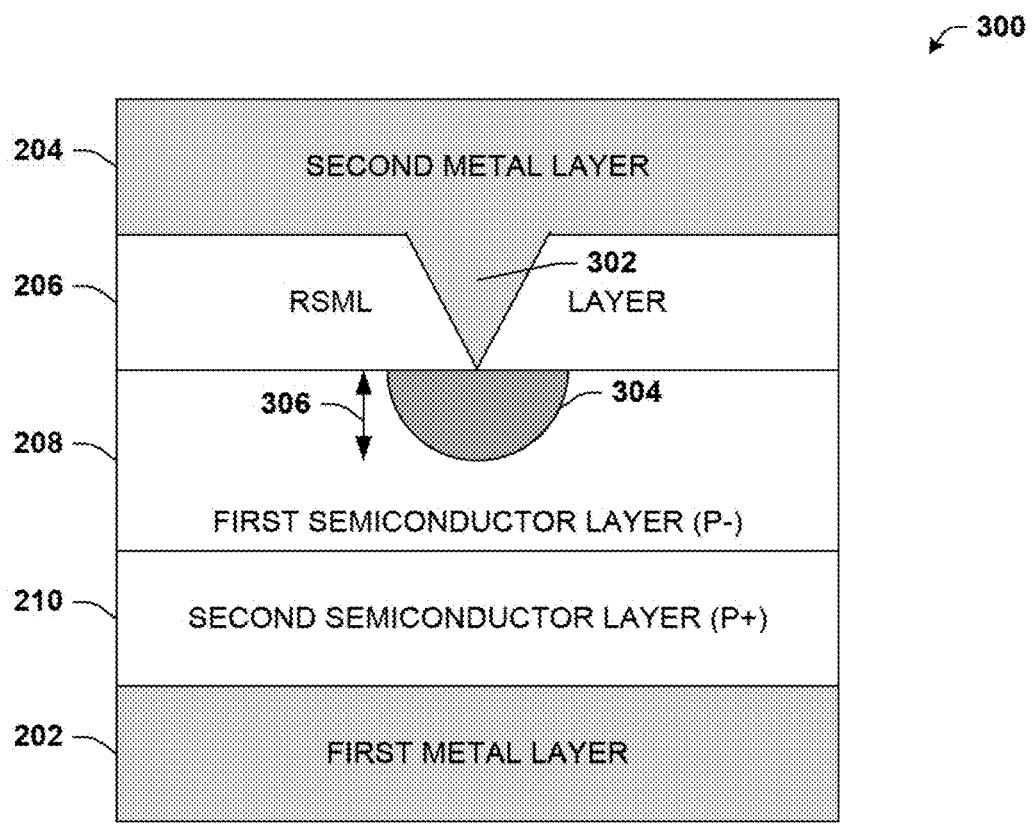
FIG. 3 illustrates a block diagram of a system that depicts additional aspects or detail in connection with the inventory component in accordance with certain embodiments of this disclosure.

Referring now to FIG. 3, apparatus 300 is provided. Apparatus 300 illustrates example features associated with apparatus 200 when in the presence of an electric field and/or when a voltage difference exists between the two electrodes (e.g., metal layers 202 and 204). While this particular example employs apparatus 200, it is understood that similar or identical features can exist for any of the aforementioned apparatuses, 100, 120, or 220 as well.

As noted previously, second metal layer 204 can be an active metal that diffuses into resistive switching material layer 206 when a voltage bias is applied, which is illustrated by diffusion region 302. When the active metal, which is a very good electrical conductor, enters resistive switching material layer 206, the resistivity of resistive switching material layer 206 becomes much lower than otherwise. Depending on the magnitude and/or other characteristics of the voltage bias, diffusion region 302 can exhibit different characteristics. For example, in the presence of a read voltage (e.g., 1 volt (V)) diffusion region 302 does not extend all the way through resistive switching material layer 206. However, in the presence of a program voltage (e.g., ~2.5 V), which is greater in magnitude than a read voltage, diffusion region 302 can include a filament that extends the entire thickness of resistive switching material layer 206, effectively negating the natural resistivity of resistive switching material layer 206. Hence, once this filament is formed (e.g., by application of a program voltage), the resistance of the cell becomes lower relative to the case in which no filament has been formed.

If an erase voltage is applied (e.g., ~−2.5 V), which is generally of similar magnitude, but opposite polarity, as the program voltage, then an opposite effect is observed. In that case, the active metal tends to retreat from resistive switching material layer 206 back toward second metal layer 204. If, when the erase voltage was applied, a filament exists, then the filament is effectively dispersed and the resistance of the cell increases.

Thus, application of a read voltage, which is not large enough to form a filament, will instead yield an indication of whether or not a filament already exists. If a filament already exists due to previous application of a program voltage, then a measure of the current through the cell will be higher than if no filament exists. Therefore, the filamentary state of the cell can be mapped to logical binary states. Additional detail relating to these features is provided in connection with FIG. 5.

Before continuing the discussion of FIG. 3, it is noted that conventional RRAM cells do not include layers 208 and 210, but can include layers somewhat similar to layers 202-206. For example, conventional metal-insulator-metal (MIM) cells are known and can operate in a manner similar to what has been described thus far in connection with FIG. 3. However, programming conventional MIM cells is a very delicate procedure that heavily relies on precise timing because conventional MIM cells cannot allow a full filament to form or a metal-to-metal short can result. If such occurs, then the cell can be damaged and/or might become incapable of being erased (e.g., retracting the filament in response to an erase voltage). Therefore, conventional MIM cells rely upon very precise timing for the program voltage that intends to create a filament, but also limit the size of the filament. This technique, while being extremely complex and prone to unnecessary errors also leads to unnecessary power wastage and unnecessary joule heating. Furthermore, conventional architectures, regardless of the technique used for programming and erasing the cell, do not provide a non-linear current-voltage relationship.

As described herein, these and other shortcomings associated with conventional techniques and architectures can be overcome or mitigated with the introduction of first semiconductor layer 208 and, in some embodiments, second semiconductor layer 210. Because first semiconductor layer 208 includes a lightly doped semiconductor material (e.g., extrinsic), first semiconductor layer 208 can act as a built in resistor that prevents the cell from being too conductive when in the "on" or program state (e.g., when a filament has formed in diffusion region 302 and/or in a filamentary state).

For example, when a program voltage is applied to the cell, and a filament forms in diffusion region 302, as this filament makes contact with first semiconductor layer 208, charge depletion region 304 can form. Charge depletion region 304 is a region that is depleted of mobile charges (e.g., an electron hole). Depth 306 associated with depletion region 304 can be a function of a voltage bias applied to the cell. Thus, first semiconductor layer 208 can eliminate or reduce transient current and/or capacitive discharge current that can damage the cell and also eliminate the need for program cycles or other bias cycles to be managed according to timing schedules.

Essentially, when a cell is being programmed to its "on" state, it is no longer undesirable that the filament extend the entire thickness of resistive switching material layer 206 since first semiconductor layer 208 can prevent damage or other negative consequences, while also introducing a non-linear relationship between current and voltage. This non-linear relationship results from the fact that depletion depth varies as a function of the applied bias, which in turn changes the current through the cell. In embodiments with second semiconductor layer 210, the highly doped (e.g., degenerate) material included therein can operate to facilitate ohmic contact between first metal layer 202 and first semiconductor layer 208.

Figure 4:
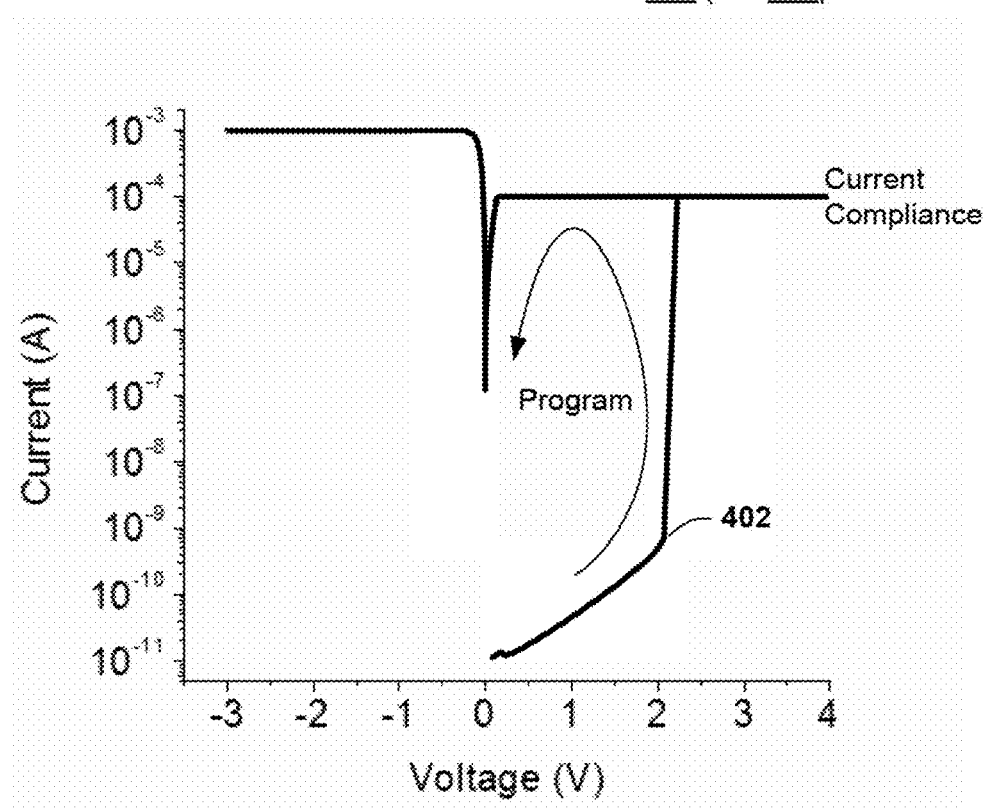
FIG. 4 illustrates an example graph of current versus voltage for an example RRAM cell that does not include first semiconductor layer in accordance with certain embodiments of this disclosure.

With reference now to FIG. 4, illustration 400 is depicted. Illustration 400 provides a graph of current versus voltage for an example RRAM cell that does not include first semiconductor layer 208 (or 228). When a program voltage (e.g., 2 V) is applied, the filament forms. Reference numeral 402 denotes the point at which the filament extends the entire thickness of resistive switching material layer 206, at which point the resistance of the cell drops substantially. Because cell resistance is lower, the current due to the program voltage rises substantially. However, because the cell in this example does not include any layer with the lightly doped semiconductor material (e.g., layers 108, 128, 208, or 228), once the cell is programmed, the cell is no longer capable of being erased. In effect, the filament has become permanent.

Figure 5:
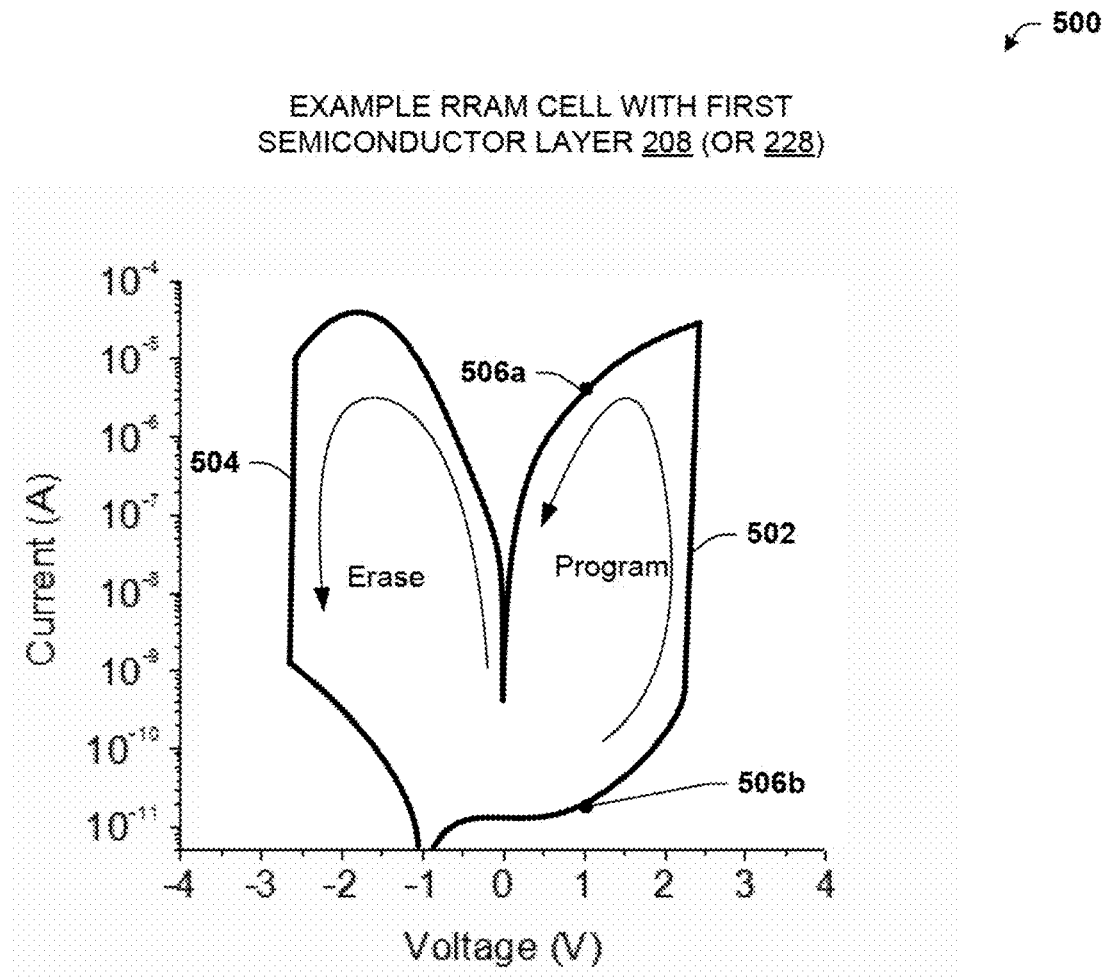
FIG. 5 illustrates an example graph of current versus voltage for an example RRAM cell that is does include first semiconductor layer in accordance with certain embodiments of this disclosure.

In contrast, turning now to FIG. 5, illustration 500 is depicted. Illustration 500 provides a graph of current versus voltage for an example RRAM cell that is does include first semiconductor layer 208 (228) such as the cells depicted by apparatuses 200 and 220. In this case, when a program voltage (e.g., 2.5 V) is applied, the filament forms and the resistance of the cell drops significantly, leading to a significant increase in the current, which is denoted by reference numeral 502. Thereafter, the cell is in the program or "on" state. If an erase voltage (e.g., −2.5 V) is applied, then the filament is dispersed causing the resistance of the cell to increase and the associated current to decrease as illustrated at reference numeral 504.

If a read voltage is applied (e.g., 1 V) then one of two results will occur. If the cell is in the program or "on" state (e.g., a filament exists), then the read voltage will produce a current through the cell associated with reference numeral 506a. On the other hand, if cell is in the erase or "off" state (e.g., full filament does not exist), then the read voltage will produce a current through the cell associated with reference numeral 506b. As can be seen, the magnitudes of the currents associated with 506a and 506b differ by about five orders of magnitude. Hence, a read voltage can be readily utilized to determine the current state of the cell and the outcome reliably mapped to logical binary states (e.g., 0 and 1).

Figure 6:
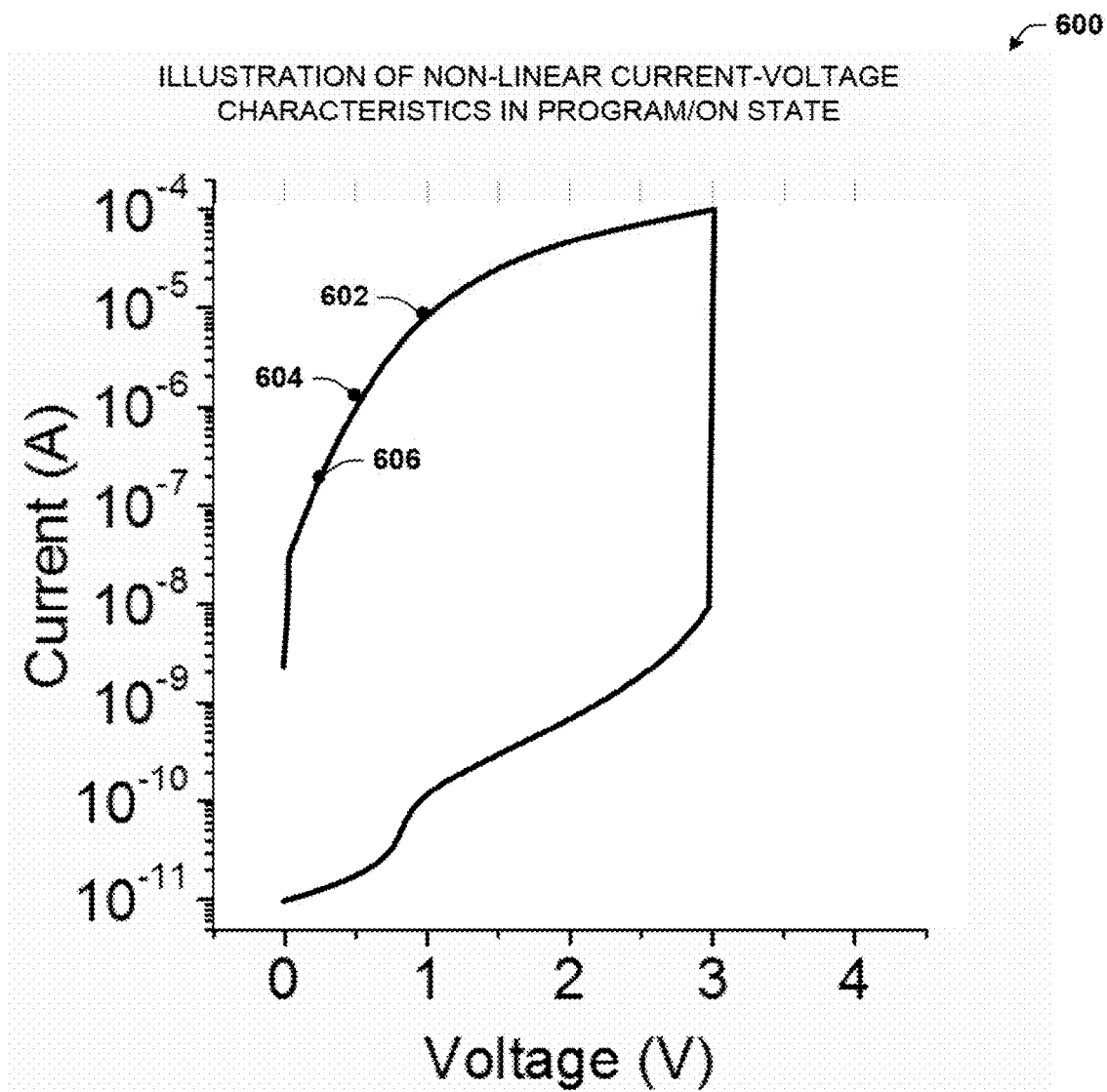
FIG. 6 illustrates an example graph depicting non-linear current-voltage characteristics for an example RRAM cell in the program or "on" state in accordance with certain embodiments of this disclosure.

Referring now to FIG. 6, illustration 600 is provided. Illustration 600 provides a graph depicting non-linear current-voltage characteristics for the cell in the program or "on" state. Initially, it is noted that sneak path currents, detailed supra, are most problematic for "off" state selected cells with "on" state half-selected cells which are located on the same bit or word lines as the selected cells, because for RRAM cells, the "on" state is associated with the state in which the resistance of the cell is lowest and the "on"-state half-selected cells can produce large sneak path currents. Hence, by providing a non-linear relationship between current and voltage for a cell in the "on" state, difficulties associated with sneak path currents can be mitigated.

In this example, reference numerals 602-606 illustrate the non-linear relationship between current and voltage. For example, when a voltage of 1 V (e.g., 602) is applied, the current through the cell is about 10 microamps (μA). When a voltage of 0.5 V is applied (e.g., 604), the current through the cell is about 1.2 μA. So, while the voltage from 602 to 604 was reduced by 50%, the current was not reduced by 50% but rather, in this case, by about 88%. Continuing to reference numeral 606, here the applied bias is about 0.3 V, whereas the current through the cell registers at about 0.2 μA. Comparing 602 to 606, the applied bias dropped by 70%, yet the current through the cell dropped by 98%, clearly illustrating the non-linear relationship.

Figure 7:
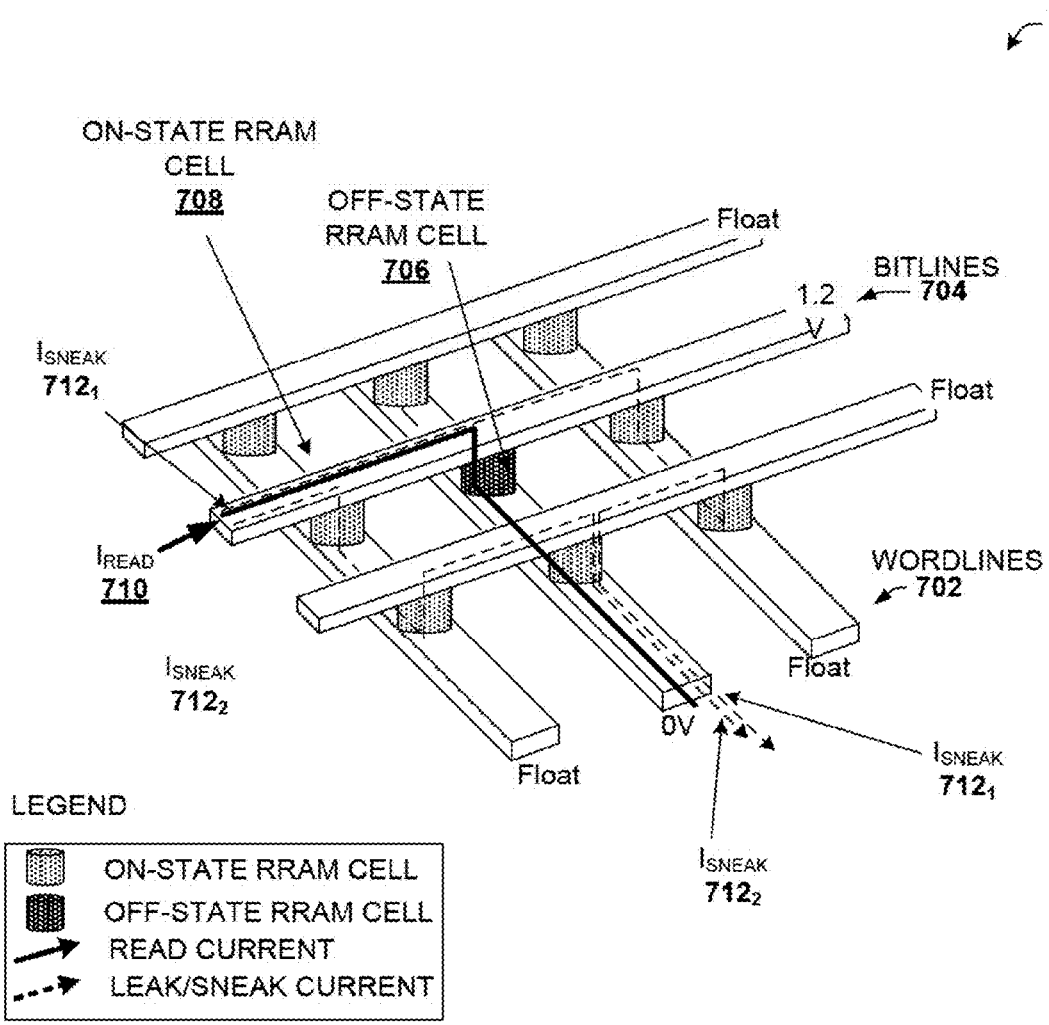
FIG. 7 illustrates a diagram of an example memory comprising an architecture of a crossbar array of RRAM cells in accordance with certain embodiments of this disclosure.

Turning now to FIG. 7, system 700 is depicted. System 700 is an example memory comprising an architecture of a crossbar array of RRAM cells. System 700 is used to illustrate practical distinctions between RRAM cells with a linear current-voltage relationship versus RRAM cells with a non-linear current-voltage relationship in connection with sneak path current. Thus two different scenarios are presented. In both cases, system 700 includes various wordlines 702 and bitlines 704 in which a single cell among the array can be selected based upon an applied bias between a particular wordline 702 and a particular bitline 704 with the selected cell representing the junction. In both example scenarios discussed below, the selected cell, cell 706, is in the "off" state while cell 708, as well as all other neighbors of cell 706, are in the "on" state. Further assume that the applied bias (e.g., read voltage) is 1.2 V, and thus, an associated read current 710 for a cell in the "on" state is 12 μA, but of a significantly lower value if the cell in is the "off" state.

It is understood that different bitlines 704 observe small differences in voltage (e.g., because the program pattern in the array is different). For instance, the middle bitline connected to selected RRAM memory cell 706 (dark shading) experiences 1.2 volts, whereas the top and bottom wordlines connected only to un-selected RRAM memory cells 708 (all lightly shaded cells) experience floating state, in other words, no voltage is applied to the un-selected bit or word lines. Even though no voltage is applied to all un-selected bit and word lines, sneak paths 712$_1$ and 712$_2$ exist between the selected bit and word lines, which can override or otherwise corrupt read current 710.

As described herein, a read operation generally involves measuring or sensing a magnitude of a current flowing through a selected memory cell in response to application of a read voltage to that selected memory cell. A read current, $I_{READ}$ 710 is depicted by a bold line, following a read path through the middle bitline 704, through selected RRAM memory cell 706, and out the middle wordline 702. However, a magnitude of $I_{READ}$ 710 will add with other currents along the read path, including the sneak path currents $712_1$ and $712_2$ (depicted by the dashed lines). Thus, sneak path currents along wordlines 702 and bitlines 704 can add to (or subtract from, depending on polarity) the magnitude of $I_{READ}$ 710, distorting its value. For instance, if the net effect of the sneak currents is to increase $I_{READ}$ 710 by several μA, then a loss of several μA of sensing margin is observed at memory architecture 700. This can negatively impact data integrity and performance of the read operations of RRAM cells of memory architecture 700. Moreover, if sneak currents net to increase $I_{READ}$ 710 on the order of about 12 μA, then the selected cell (cell 706), which is in the "off" state and therefore should have a read current 710 several orders of magnitude lower, might actually be sensed as being in the "on" state.

Thus, in a first case, consider the crossbar array of system 700 is populated with conventional RRAM cells that exhibit a linear current-voltage relationship. In that case, read current 710 of 12 μA flows through cell 706 and sneak path currents 712 are produced. Since the cells have a linear current-voltage relationship, the individual magnitudes of these sneak path currents is approximately 4 μA as read bias (1.2V in this example) also drops across three cells along the sneak path (e.g., if 1.2 V produces 12 μA then, linearly, 0.4 V produces 4 μA). Hence, even though cell 706 is in the "off" state, cell 708 can observe a significant current flow.

However, if the current-voltage relationship is non-linear for cells, then the magnitudes of these sneak path currents can be significantly reduced. So, in the second case, consider the crossbar array of system 700 is populated with RRAM cells described herein (e.g., apparatus 200), in which the cell exhibits a non-linear relationship between current and voltage. In that case, a voltage differential of 0.4 V (that produced a sneak current of 4 μA in the linear case) might only produce a sneak current of 0.12 μA. Therefore, when compared to the linear case, the non-linear case provides a significantly larger margin for on-off state comparison and lower power consumption.

Example Method for Fabricating an RRAM Cell with a Non-Linear Current-Voltage Relationship The aforementioned diagrams have been described with respect to interaction between several components, or memory architectures. It should be appreciated that such diagrams can include those components and architectures specified therein, some of the specified components/architectures, and/or additional components/architectures. Sub-components can also be implemented as electrically connected to other sub-components rather than included within a parent architecture. Additionally, it is noted that one or more disclosed processes can be combined into a single process providing aggregate functionality. For instance, a program process can comprise an erase process, or vice versa, to facilitate programming and erasing a semiconductor cell by way of a single process. In addition, it should be appreciated that respective rows of disclosed memory architectures can be erased in groups (e.g., multiple rows erased concurrently) or individually. Moreover, it should be appreciated that multiple RRAM cells on a particular row can be programmed in groups (e.g., multiple RRAM cells programmed concurrently) or individually. Components of the disclosed architectures can also interact with one or more other components not specifically described herein but known by those of skill in the art.

Figure 8:
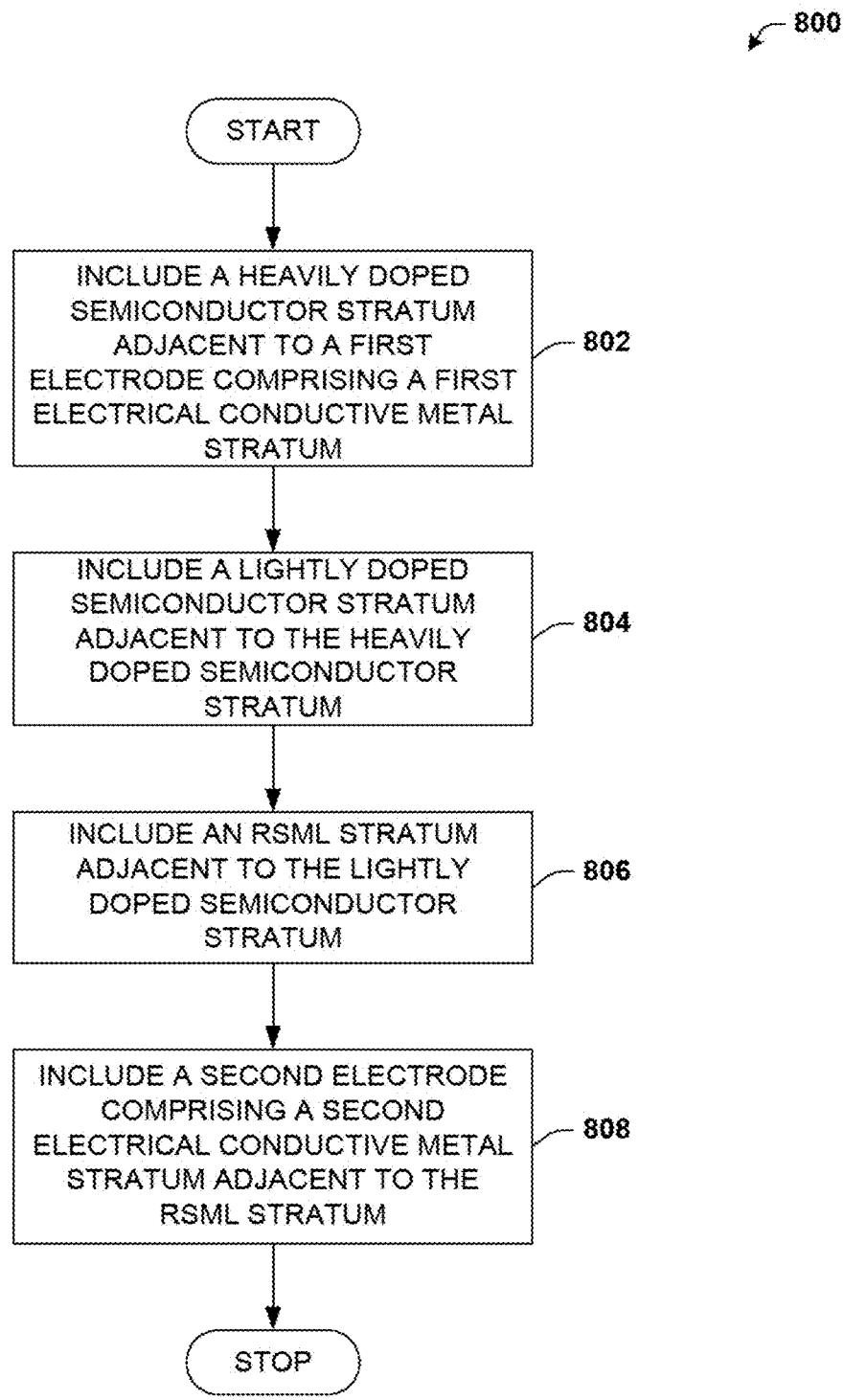
FIG. 8 illustrates an example methodology that can provide for fabricating an RRAM cell in accordance with certain embodiments of this disclosure.

In view of the exemplary diagrams described supra, process methods that can be implemented in accordance with the disclosed subject matter will be better appreciated with reference to the flow chart of FIG. 8. While for purposes of simplicity of explanation, the method of FIG. 8 is shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 8 illustrates exemplary method 800. Method 800 can provide for fabricating a resistive random access memory (RRAM) cell. The RRAM cell fabricated according to method 800 can exhibit a non-linear relationship between current and voltage. For example, at reference numeral 802, a heavily doped (e.g., degenerate) semiconductor stratum can be included adjacent to a first electrode comprising a first electrical conductive metal stratum. It is understood that the strata included at reference numeral 802 as well as other reference numerals detailed herein can be performed by or facilitated by a system including a processor, an example of which can be found with reference to FIG. 10.

At reference numeral 804, a lightly doped (e.g., extrinsic) semiconductor stratum can be included adjacent to the heavily doped semiconductor stratum. At reference numeral 806, a resistive switching material stratum comprising an electrical insulator material can be included adjacent to the lightly doped semiconductor stratum. At reference numeral 808, a second electrode comprising a second electrical conductive metal stratum can be included adjacent to the resistive switching material stratum.

In some embodiments, the lightly doped semiconductor stratum can be characterized by a resistivity of between 0.2 and 50 ohms-cm. The heavily doped semiconductor stratum can be characterized by a resistivity of between 0.001 and 0.05 ohms-cm. Furthermore, it is understood that in various embodiments, the lightly doped semiconductor stratum and the heavily doped semiconductor stratum can be comprised of either p-type semiconductor material or n-type semiconductor material.

Example Operating Environments

Figure 9:
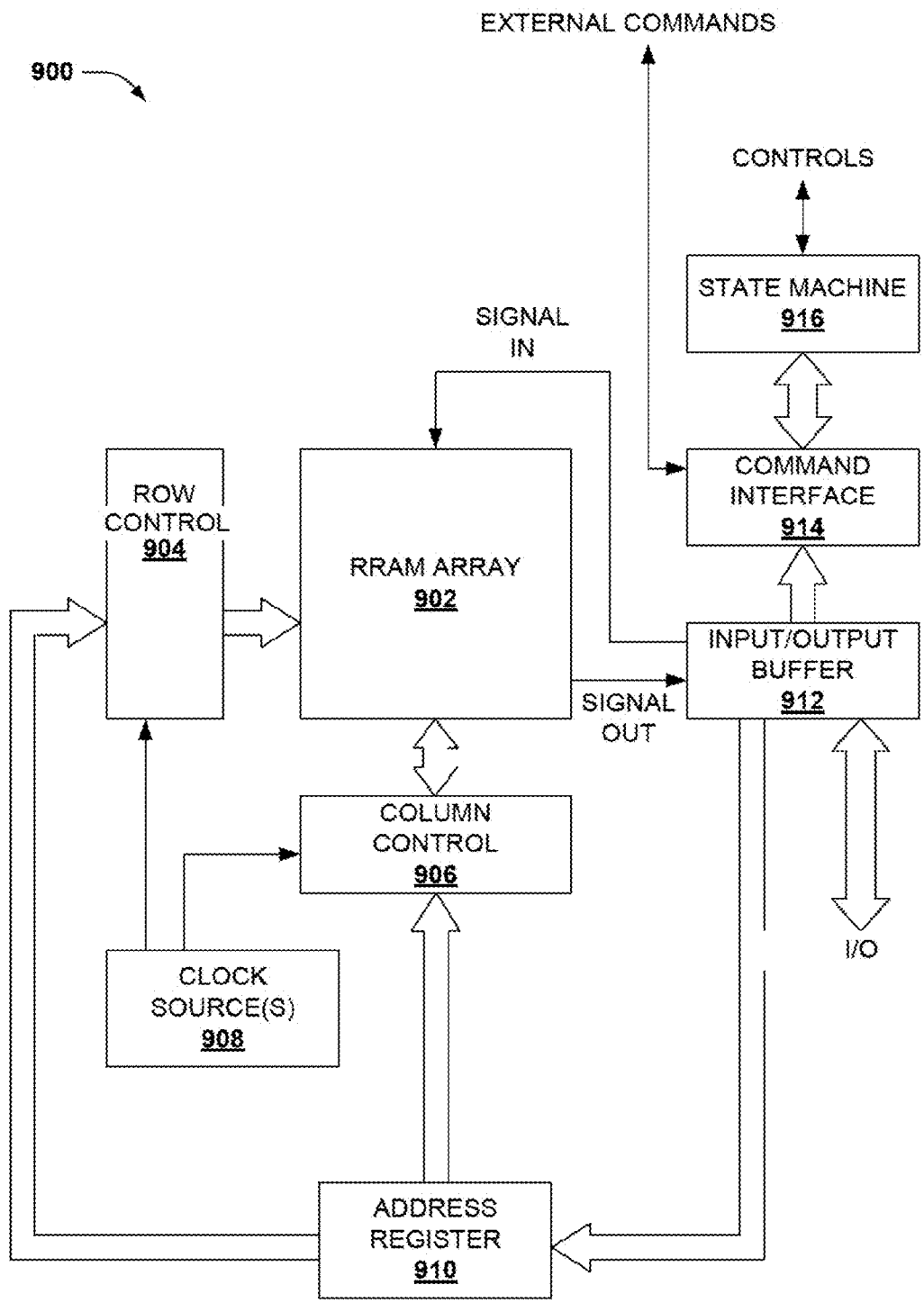
FIG. 9 illustrates a block diagram of an example electronic operating environment in accordance with certain embodiments of this disclosure.

In order to provide a context for the various aspects of the disclosed subject matter, FIG. 9, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, or the like. In a distributed computing environment, program modules can be located in both local and remote memory storage modules or devices.

FIG. 9 illustrates a block diagram of an example operating and control environment 900 for a RRAM array 902 according to aspects of the subject disclosure. In at least one aspect of the subject disclosure, RRAM array 902 can comprise a variety of RRAM memory cell technology. Particularly, RRAM array can be configured or operated to mitigate or avoid sneak path currents of the RRAM array, as described herein.

A column controller 906 can be formed adjacent to RRAM array 902. Moreover, column controller 906 can be electrically coupled with bit lines of RRAM array 902. Column controller 906 can control respective bitlines, applying suitable program, erase or read voltages to selected bitlines.

In addition, operating and control environment 900 can comprise a row controller 904. Row controller 904 can be formed adjacent to column controller 906, and electrically connected with word lines of RRAM array 902. Row controller 904 can select particular rows of memory cells with a suitable selection voltage. Moreover, row controller 904 can facilitate program, erase or read operations by applying suitable voltages at selected word lines.

A clock source(s) 908 can provide respective clock pulses to facilitate timing for read, write, and program operations of row control 904 and column control 906. Clock source(s) 908 can further facilitate selection of word lines or bit lines in response to external or internal commands received by operating and control environment 900. An input/output buffer 912 can be connected to an external host apparatus, such as a computer or other processing device (not depicted) by way of an I/O buffer or other I/O communication interface. Input/output buffer 912 can be configured to receive write data, receive an erase instruction, output readout data, and receive address data and command data, as well as address data for respective instructions. Address data can be transferred to row controller 904 and column controller 906 by an address register 910. In addition, input data is transmitted to RRAM array 902 via signal input lines, and output data is received from RRAM array 902 via signal output lines. Input data can be received from the host apparatus, and output data can be delivered to the host apparatus via the I/O buffer.

Commands received from the host apparatus can be provided to a command interface 914. Command interface 914 can be configured to receive external control signals from the host apparatus, and determine whether data input to the input/output buffer 912 is write data, a command, or an address. Input commands can be transferred to a state machine 916.

State machine 916 can be configured to manage programming and reprogramming of RRAM array 902. State machine 916 receives commands from the host apparatus via input/output interface 912 and command interface 914, and manages read, write, erase, data input, data output, and like functionality associated with RRAM array 902. In some aspects, state machine 916 can send and receive acknowledgments and negative acknowledgments regarding successful receipt or execution of various commands.

To implement read, write, erase, input, output, etc., functionality, state machine 916 can control clock source(s) 908. Control of clock source(s) 908 can cause output pulses configured to facilitate row controller 904 and column controller 906 implementing the particular functionality. Output pulses can be transferred to selected bit lines by column controller 906, for instance, or word lines by row controller 904, for instance.

In connection with FIG. 10, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 10:
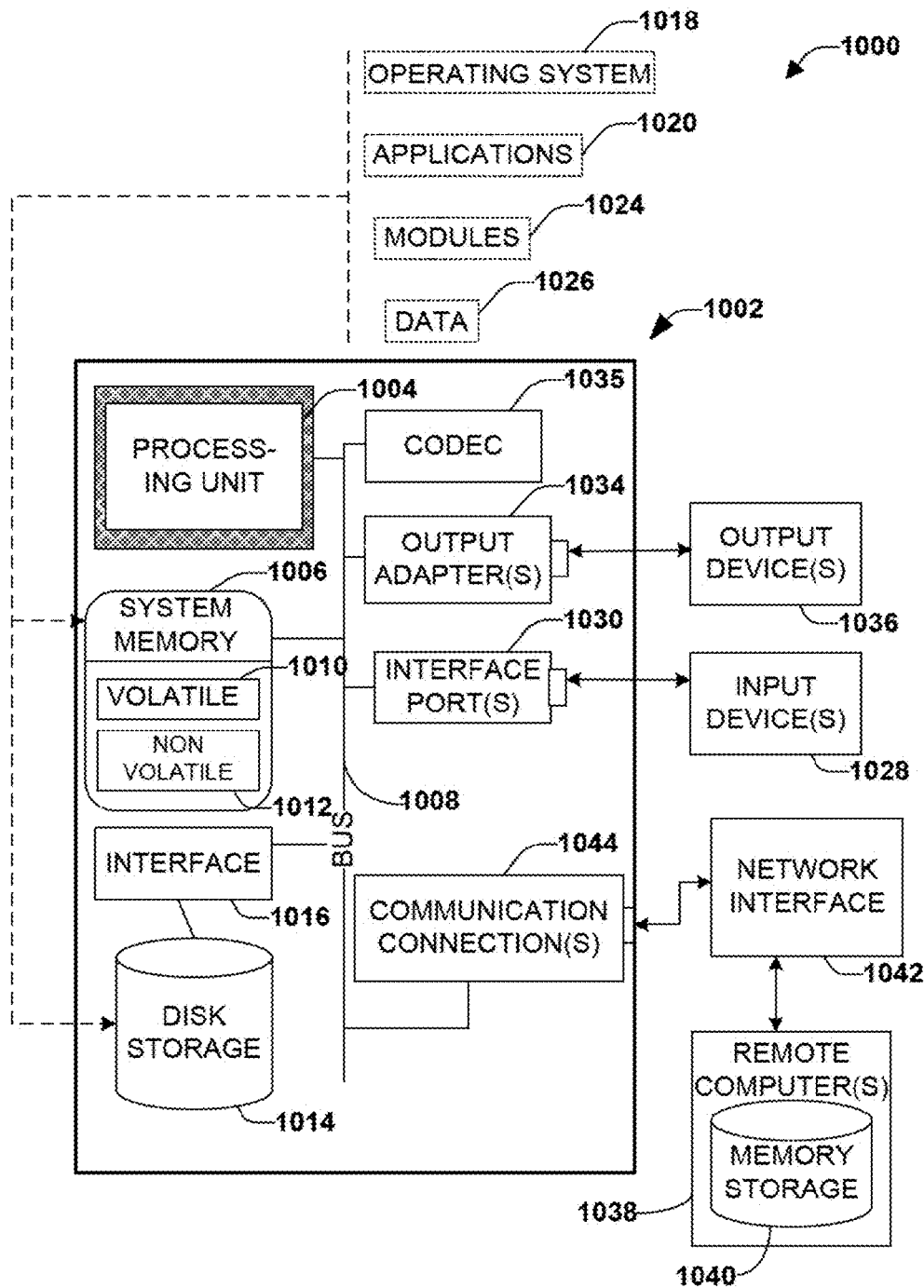
FIG. 10 illustrates an example schematic block diagram for a computing environment in accordance with certain embodiments of this disclosure.

With reference to FIG. 10, a suitable environment 1000 for implementing various aspects of the claimed subject matter includes a computer 1002. The computer 1002 includes a processing unit 1004, a system memory 1006, a codec 1035, and a system bus 1008. The system bus 1008 couples system components including, but not limited to, the system memory 1006 to the processing unit 1004. The processing unit 1004 can be any of various available processors. Dual microprocessors and other multiprocessor architectures also can be employed as the processing unit 1004.

The system bus 1008 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1006 includes volatile memory 1010 and non-volatile memory 1012. The basic input/output system (BIOS), containing the basic routines to transfer information between elements within the computer 1002, such as during start-up, is stored in non-volatile memory 1012. In addition, according to present innovations, codec 1035 may include at least one of an encoder or decoder, wherein the at least one of an encoder or decoder may consist of hardware, software, or a combination of hardware and software. Although, codec 1035 is depicted as a separate component, codec 1035 may be contained within non-volatile memory 1012. By way of illustration, and not limitation, non-volatile memory 1012 can include read only memory (ROM), programmable ROM (PROM), electrically programmable ROM (EPROM), electrically erasable programmable ROM (EEPROM), or flash memory. Volatile memory 1010 includes random access memory (RAM), which acts as external cache memory. According to present aspects, the volatile memory may store the write operation retry logic (not shown in FIG. 10) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 1002 may also include removable/non-removable, volatile/non-volatile computer storage medium. FIG. 10 illustrates, for example, disk storage 1014. Disk storage 1014 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1014 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1014 to the system bus 1008, a removable or non-removable interface is typically used, such as interface 1016. It is appreciated that storage devices 1014 can store information related to a user. Such information might be stored at or provided to a server or to an application running on a user device. In one embodiment, the user can be notified (e.g., by way of output device(s) 1036) of the types of information that are stored to disk storage 1014 and/or transmitted to the server or application. The user can be provided the opportunity to opt-in or opt-out of having such information collected and/or shared with the server or application (e.g., by way of input from input device(s) 1028).

It is to be appreciated that FIG. 10 describes software that acts as an intermediary between users and the basic computer resources described in the suitable operating environment 1000. Such software includes an operating system 1018. Operating system 1018, which can be stored on disk storage 1014, acts to control and allocate resources of the computer system 1002. Applications 1020 take advantage of the management of resources by operating system 1018 through program modules 1024, and program data 1026, such as the boot/shutdown transaction table and the like, stored either in system memory 1006 or on disk storage 1014. It is to be appreciated that the claimed subject matter can be implemented with various operating systems or combinations of operating systems.

A user enters commands or information into the computer 1002 through input device(s) 1028. Input devices 1028 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1004 through the system bus 1008 via interface port(s) 1030. Interface port(s) 1030 include, for example, a serial port, a parallel port, a game port, and a universal serial bus (USB). Output device(s) 1036 use some of the same type of ports as input device(s) 1028. Thus, for example, a USB port may be used to provide input to computer 1002 and to output information from computer 1002 to an output device 1036. Output adapter 1034 is provided to illustrate that there are some output devices 1036 like monitors, speakers, and printers, among other output devices 1036, which require special adapters. The output adapters 1034 include, by way of illustration and not limitation, video and sound cards that provide a means of connection between the output device 1036 and the system bus 1008. It should be noted that other devices and/or systems of devices provide both input and output capabilities such as remote computer(s) 1038.

Computer 1002 can operate in a networked environment using logical connections to one or more remote computers, such as remote computer(s) 1038. The remote computer(s) 1038 can be a personal computer, a server, a router, a network PC, a workstation, a microprocessor based appliance, a peer device, a smart phone, a tablet, or other network node, and typically includes many of the elements described relative to computer 1002. For purposes of brevity, only a memory storage device 1040 is illustrated with remote computer(s) 1038. Remote computer(s) 1038 is logically connected to computer 1002 through a network interface 1042 and then connected via communication connection(s) 1044. Network interface 1042 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1044 refers to the hardware/software employed to connect the network interface 1042 to the bus 1008. While communication connection 1044 is shown for illustrative clarity inside computer 1002, it can also be external to computer 1002. The hardware/software necessary for connection to the network interface 1042 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A resistive switching memory cell, comprising:
a first metal layer comprising a first electrical conductive metal;
a second metal layer comprising a second electrical conductive metal;
a resistive switching material layer situated between the first metal layer and the second metal layer comprising a switching material that is an electrical insulator;
a first semiconductor layer situated between the resistive switching material layer and the first metal layer comprising a lightly doped semiconductor material, wherein the first semiconductor layer is in contact with the resistive switching material layer and has a resistivity that measures between about 0.2 ohm-centimeter and about 20 ohm-centimeter; and
a second semiconductor layer situated between the first semiconductor layer and the first metal layer comprising a highly doped semiconductor material, wherein the second semiconductor layer is between 5 nanometers and 100 nanometers thick and the highly doped semiconductor material comprises at least one of silicon, silicon germanium or a derivative of silicon germanium in a poly-crystalline phase.

2. The resistive switching memory cell of claim 1, wherein the second metal is an active metal that diffuses into the switching material in response to an electric field.

3. The resistive switching memory cell of claim 2, wherein the active metal comprises at least one of copper, titanium, or silver.

4. The resistive switching memory cell of claim 1, wherein the resistive switching material layer is between 2 nanometer and 100 nanometers thick and the switching material comprises at least one of silicon, silicon germanium, silicon dioxide, or a derivative of silicon dioxide.

5. The resistive switching memory cell of claim 1, wherein the first semiconductor layer is between 5 nanometers and 100 nanometers thick and the lightly doped semiconductor material comprises at least one of silicon, silicon germanium, or a derivative of silicon germanium in a poly-crystalline phase or an amorphous phase.

6. The resistive switching memory cell of claim 1, wherein a resistivity measurement of the second semiconductor layer is between 0.001 ohm-centimeter and 0.05 ohm-centimeter.

7. The resistive switching memory cell of claim 1, wherein the highly doped semiconductor material is a p (positive)-type semiconductor or an n (negative)-type semiconductor.

8. The resistive switching memory cell of claim 1, wherein the lightly doped semiconductor material is a p (positive)-type semiconductor or an n (negative)-type semiconductor.

9. The resistive switching memory cell of claim 1, wherein the first semiconductor layer comprises a depletion region in response to contact from a filament of the second electrical conductive metal that diffuses into the resistive switching material layer in response to an electric field, wherein a depth of the depletion region is a function of a voltage associated with the electric field.

10. A method for fabricating a resistive memory cell, comprising:
  including a heavily doped semiconductor stratum adjacent to a first electrode comprising a first electrical conductive stratum;
  including a lightly doped semiconductor stratum adjacent to the heavily doped semiconductor stratum;
  including a resistive switching material stratum comprising an electrical insulator material having a first resistance adjacent to the lightly doped semiconductor stratum and forming the resistive switching material stratum to be at least in part permeable to particles of a metal material; and
  including a second electrode comprising a second electrical conductive stratum comprising the metal material and adjacent to the resistive switching material stratum, wherein particles of the metal material, in response to a first bias, form a conductive path through the resistive switching material stratum having a second resistance lower than the first resistance, and wherein electrical continuity of the conductive path is broken in response to a second bias of different polarity from the first bias.

11. The method of claim 10, wherein the lightly doped semiconductor stratum is characterized by a resistivity of between 0.2 ohm-centimeter and 20 ohm-centimeter.

12. The method of claim 10, wherein the heavily doped semiconductor stratum is characterized by a resistivity of between 0.001 ohm-centimeter and 0.05 ohm-centimeter.

13. The method of claim 10, wherein the lightly doped semiconductor stratum comprises a p-type semiconductor material or an n-type semiconductor material.

14. The method of claim 10, wherein the heavily doped semiconductor stratum comprises a p-type semiconductor material or an n-type semiconductor material.

15. The method of claim 10, wherein including the resistive switching material stratum further comprising forming the resistive switching material stratum from an amorphous silicon material.

16. The method of claim 10, wherein including the lightly doped semiconductor stratum further comprising forming the lightly doped semiconductor stratum at a thickness within a range between about 5 nanometers(nm) and about 100 nm.

17. The method of claim 10, wherein including the resistive switching material stratum further comprising:
  forming the lightly doped semiconductor stratum comprising a p+ polycrystalline silicon or a p+ silicon germanium material; and
  forming the resistive switching material stratum from an upper region of the p+ polycrystalline silicon or the p+ silicon germanium material and into a non-conductive amorphous silicon having p-type impurities or a native silicon oxide.

18. A non-transitory computer-readable medium having instructions stored thereon that, in response to execution, cause a system including a processor to perform operations comprising:
  forming a heavily doped semiconductor stratum adjacent to a first electrode comprising a first electrical conductive stratum;
  forming a lightly doped semiconductor stratum adjacent to the heavily doped semiconductor stratum;
  forming a resistive switching material stratum comprising an electrical insulator material having a first resistance adjacent to the lightly doped semiconductor stratum and forming the resistive switching material stratum to be at least in part permeable to particles of a metal material; and
  forming a second electrode comprising a second electrical conductive stratum comprising the metal material and adjacent to the resistive switching material stratum, wherein particles of the metal material, in response to a first bias, form a conductive path through the resistive switching material stratum having a second resistance lower than the first resistance, and wherein electrical continuity of the conductive path is broken in response to a second bias of different polarity from the first bias.

19. The non-transitory computer-readable medium of claim 18, wherein the forming the resistive switching material stratum further comprising forming the resistive switching material stratum from an amorphous silicon material.

20. The non-transitory computer-readable medium of claim 18, wherein the forming the resistive switching material stratum further comprises:
  forming the lightly doped semiconductor stratum comprising a p+ polycrystalline silicon or a p+ silicon germanium material; and
  forming the resistive switching material stratum from an upper region of the p+ polycrystalline silicon or the p+ silicon germanium material and into a non-conductive amorphous silicon having p-type impurities or a native silicon oxide.

* * * * *